United States Patent
Lam

(12) 
(10) Patent No.: US 8,018,065 B2
(45) Date of Patent: Sep. 13, 2011

(54) WAFER-LEVEL INTEGRATED CIRCUIT PACKAGE WITH TOP AND BOTTOM SIDE ELECTRICAL CONNECTIONS

(75) Inventor: Ken Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 449 days.

(21) Appl. No.: 12/039,335

(22) Filed: Feb. 28, 2008

(65) Prior Publication Data

US 2009/0218698 A1 Sep. 3, 2009

(51) Int. Cl.
*H01L 23/48* (2006.01)
(52) U.S. Cl. ... 257/773; 257/774; 257/620; 257/E27.01; 438/113; 438/460
(58) Field of Classification Search ........... 257/773, 257/774, 620, 621, E27.01; 438/460, 462, 438/612
See application file for complete search history.

(56) References Cited

U.S. PATENT DOCUMENTS

| | | |
|---|---|---|
| 6,110,825 A | 8/2000 | Mastromatteo et al. |
| 6,541,301 B1 | 4/2003 | Raymond |
| 6,768,189 B1 | 7/2004 | Anderson et al. |
| 6,836,020 B2 | 12/2004 | Cheng et al. |
| 6,912,078 B2 | 6/2005 | Hudrle et al. |
| 7,005,388 B1 | 2/2006 | Hopper et al. |
| 7,109,842 B1 | 9/2006 | Padmanabhan et al. |
| 7,211,877 B1 | 5/2007 | Zandman et |
| 7,232,754 B2 | 6/2007 | Kirby et al. |
| 2002/0139577 A1 | 10/2002 | Miller |
| 2006/0261446 A1* | 11/2006 | Wood et al. ......... 257/621 |
| 2006/0273430 A1 | 12/2006 | Hua et al. |

FOREIGN PATENT DOCUMENTS

WO WO 2007/089207 8/2007

* cited by examiner

*Primary Examiner* — Thinh Nguyen
(74) *Attorney, Agent, or Firm* — Fish & Richardson P.C.

(57) ABSTRACT

A wafer-level, batch processed, die-sized integrated circuit (IC) package with both top and bottom side electrical connections is disclosed. In one aspect, a number of bonding wires can be attached to bond pads on the top side (active circuit side) of an IC wafer. Trenches can be formed in the wafer at scribe regions and the bonding wires can extend through the trench. The trench can be filled with coating material. The bonding wires can be partially exposed on the top and/or bottom sides of the wafer to distribute electrical connections from the bond pads to the top and/or bottom sides of the wafer.

7 Claims, 6 Drawing Sheets

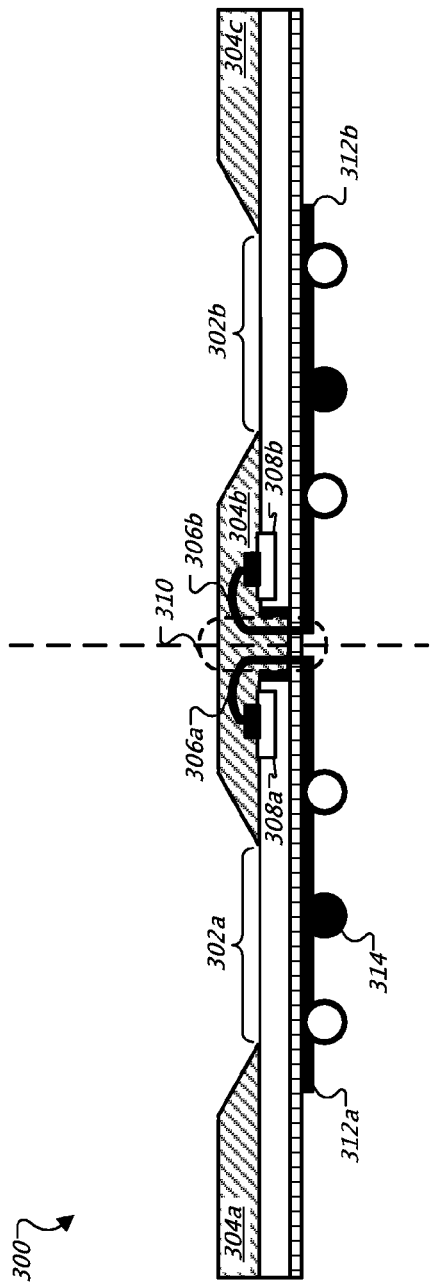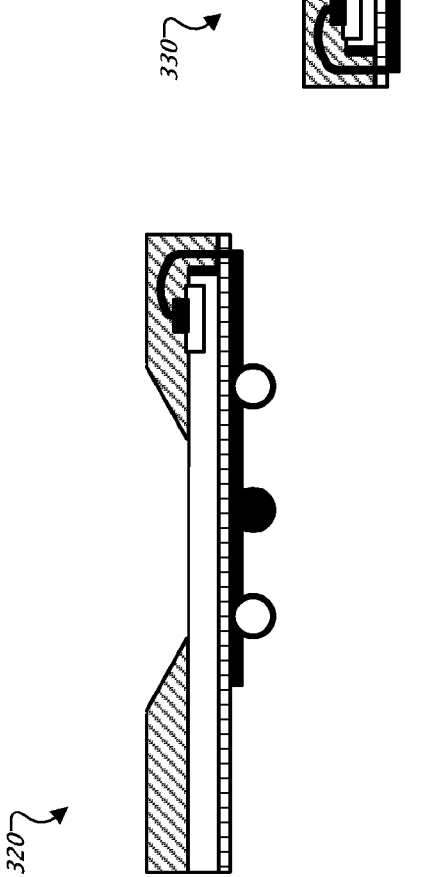
FIG. 3A
FIG. 3B

WAFER-LEVEL INTEGRATED CIRCUIT PACKAGE WITH TOP AND BOTTOM SIDE ELECTRICAL CONNECTIONS

TECHNICAL FIELD

This subject matter is generally related integrated circuit (IC) wafer processing.

BACKGROUND

Wafer-level Chip Scale package (WLCSP) techniques are often used for high density component packaging for portable computing devices, mobile handsets, image sensors, etc. WLCSP techniques can include packaging, testing, and performing burn-in operations prior to singulation of the wafer into individual IC chips. During singulation, a dicing machine saws the wafer along scribe lines to separate the individual IC chips. Once an IC chip has been singulated, the IC chip can be mounted on a printed circuit board (PCB).

A typical WLSCP IC chip uses metal (e.g., solder) rather than wires or pins for mounting onto a PCB. Typically, wire-bond pads are designed and fabricated along the edges on the top or circuit side of the IC chip. In most cases, the wire-bond pads are of small geometry and are also too close to each other for WLCSP-size solder ball formation. A redistribution layer (RDL) includes metal traces which make contact with the wire-bond pads and relocate the signals to desired locations within the IC chip where greater real estate provides space for forming larger attachment pads. The larger attachment pads can be used for placement of larger diameter solder balls. Solder balls can be deposited to at the new locations to facilitate assembly onto PCBs or other IC devices.

Since the solder balls are formed only on the top or circuit side of the wafer, the WLCSP cannot be used for device stacking applications due to the absence of connection pads on the bottom side of the wafer that are electrically connected to the top side. The presence of the I/O pads on the top or active circuit side can render WLCSP unfeasible for some sensor applications due to physical blocking of sensor elements by I/O features.

Currently, these problems are addressed by forming conductive "vias" through the core silicon or substrate to achieve top to bottom side electrical connections in the WLCSP. For example, an atmospheric downstream plasma (ADP) process can be used to etch cavities in the IC wafer's core silicon by using an aluminum mask. Dielectric material and metal conductors are deposited onto the "sidewall" of the cavities. The cavities are then filled with a polymer. The silicon wafer is "thinned" to expose the conductor metal on the other side of the wafer. In another example, a Through-Wafer-Interconnect (TWI) process forms vias through the silicon core material, insulates the sidewalls and then fills the vias with conductor to achieve electrical connectivity from one side of the IC wafer to the other side. Some package assembly contractors are also developing similar Through-Silicon-Via technologies to achieve "top-bottom" electrical connectivity.

SUMMARY

A wafer-level, batch processed, die-sized IC package with both top and bottom side electrical connections is disclosed. In one aspect, a number of bonding wires can be attached to bond pads on the top side (active circuit side) of an IC wafer. Trenches can be formed in the wafer at scribe regions and the bonding wires can be arranged to extend through the trench to the bottom side of the wafer. The trench can be filled with coating material. The bonding wires can be partially exposed on the top and/or bottom sides of the wafer to electrically connect pad sites on the top and/or bottom sides of the wafer.

The disclosed WLCSP techniques provide advantages over conventional techniques by utilizing standard wire bonding technology to achieve electrical conductivity between top and bottom sides of an IC die at a wafer level. The disclosed implementations do not require complex TSV processing that can include complex via feature designs, tooling, equipment and processes. TSV processes are costly and require advanced process development efforts.

Another advantage provided by the disclosed WLCSP is that standard IC design rules can be used which allow placement of circuitry elements directly underneath wire-bond pads. In conventional TSV processing, the via has to exit both the top and bottom sides of the wafer, and circuitry cannot be placed at the via. Thus TSV can result in a larger IC die requirement than the disclosed WLCSP techniques.

DESCRIPTION OF DRAWINGS

FIGS. 3A-3B are cross-sectional views illustrating an example wafer with bottom side electrical connections for use in a sensor application.

DETAILED DESCRIPTION

Example WLCSP

FIGS. 1A-1D illustrate an example semiconductor wafer 100 with top and bottom side electrical connections. In some implementations, wafer 100 can be fabricated using the fabrication process described in reference to FIG. 2.

Figure 1A:
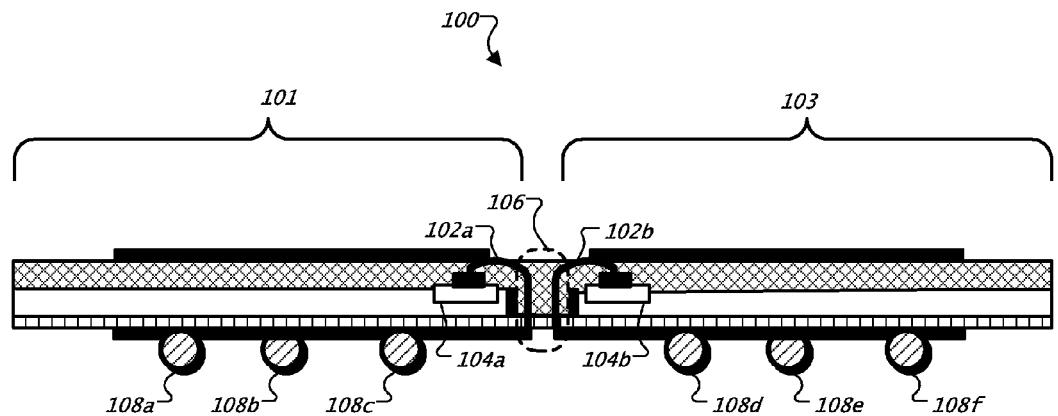
FIGS. 1A-1D illustrate an example semiconductor wafer with top and bottom side electrical connections.

FIG. 1A is a cross-sectional of view wafer 100 including two IC dies 101, 103, separated by a scribe region 106. In practice, a typical wafer can hold more than two IC dies. Bonding wires 102 are connected at one end to bond pads 104. Bonding wires 102 are routed through a trench formed in scribe region 106 from the top or active circuit side of wafer 100 to the bottom side of wafer 100. Bonding wires 102 can be made of copper, gold, aluminum or any other suitable metal. Bonding wires 102 allow access to the electrical connections provided by bond pads 104. Bonding wires 102 are available for electrical connection through a top exposure area (e.g., scribe region 106 at the top of wafer 100) and a bottom exposure area (e.g., scribe region 106 at the bottom of wafer 100). Solder balls 108 can be attached to the bottom of wafer 100 for mating singulated IC dies 101, 103 to a PCB or other IC device.

Figure 1B:
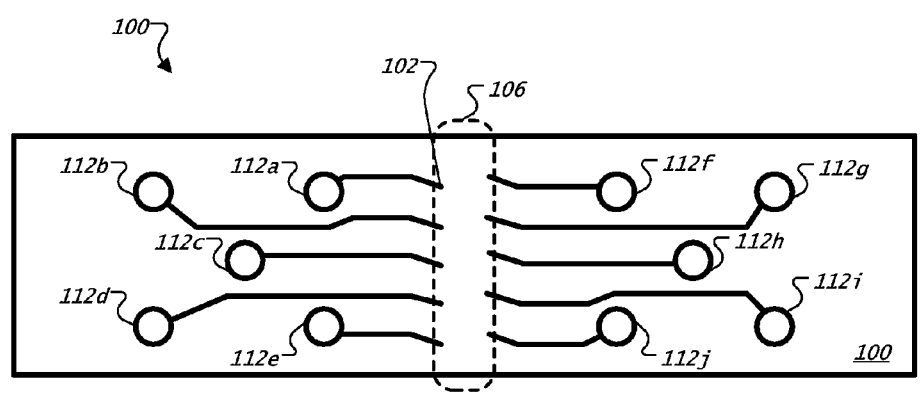

FIG. 1B is a top (circuit-side) plan view of wafer 100. In the configuration shown, exposed bonding wires 102 are routed from the top exposure area of scribe region 106 to electrical connection pad sites 112 within wafer 100 using a redistribution layer (RDL). Individual RDL metal traces connect electrical signals from the top exposure area of scribe region 106 to connection pad sites 112. RDL traces can be created, for example, using alternating layers of organic or inorganic repassivation and metallization or employing electroplating techniques. An organic layer, such as a solder mask, can optionally be applied to the RDL traces to protect the exposed metal.

Figure 1C:
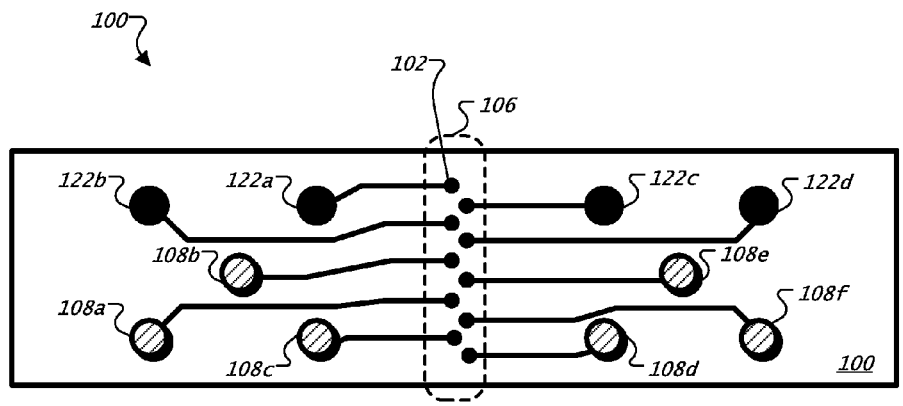

FIG. 1C is a bottom view of wafer 100. In the configuration shown, exposed bonding wires 102 in wafer 100 have been exposed within the bottom exposure area of scribe region 106. For example, the bottom side of wafer 100 can be coated with an organic or inorganic dielectric layer (e.g., silicon oxides, silicon nitrides, polyimide, benzocyclobutene (BCB), epoxy, epoxy mold compound). The dielectric layer within the region of bonding wires 102 can then be patterned to expose bonding wires 102.

From scribe region 106, the electrical connections provided by exposed bonding wires 102 can be routed to a electrical connection pad sites 122 using the RDL traces. Solder balls 108 can optionally be applied to electrical connection pad sites 122. Solder balls 108 can aid in connecting the singulated IC dies 101, 103 to a PCB or other IC device for stacked-die packaging solutions.

Figure 1D:
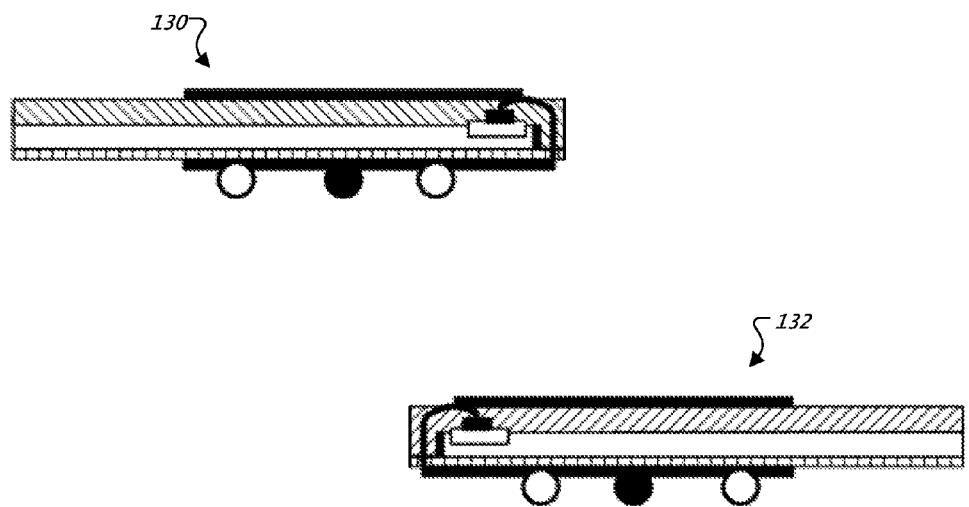

As shown in FIG. 1D, upon completion of the fabrication process, the wafer 100 can be separated (e.g., sawed) along scribe region 106 into a first IC die 130 and a second IC die 132.

Example Fabrication Process

Figure 2A:
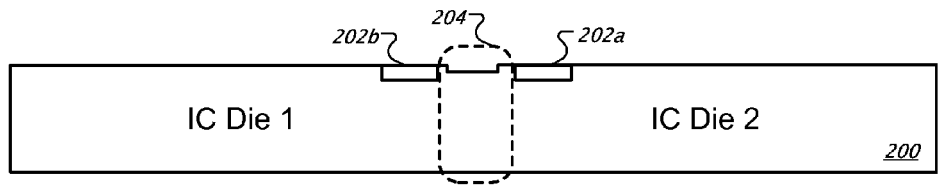
FIGS. 2A-2J are cross-sectional views illustrating an example process for fabricating a WLCSP with top and bottom side electrical connections.

FIGS. 2A-2J are cross-sectional views illustrating an example process for fabricating a WLCSP. FIG. 2A illustrates a semiconductor wafer 200 including bond pads 202 disposed on silicon core material (substrate) and distributed on opposite sides of a scribe region 204. Scribe region 204 separates two or more adjacent IC dies.

Figure 2B:
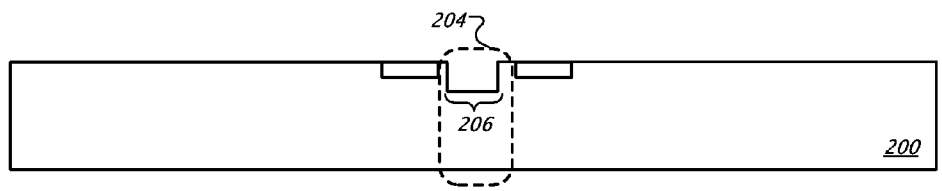

FIG. 2B illustrates a trench 206 created within scribe region 204. Trench 206, in some examples, can be created using a sawing technique (e.g., diamond saw) or an etching technique. In some implementations, trench 206 can have a depth of about two microns beneath the "lowest" circuitry element disposed within wafer 200. For example, if a circuitry element is disposed within wafer 200 at about two microns beneath the top side of wafer 200, trench 206 can be sawed or etched to a depth of about four microns beneath the top side of IC wafer 200.

Figure 2C:
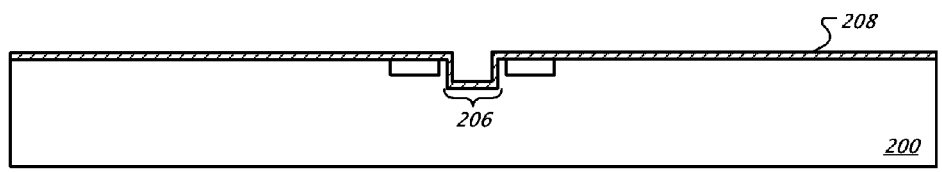
Figure 2D:
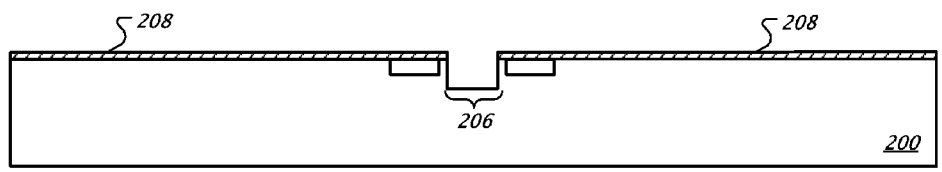

As shown in FIG. 2C, after trench 206 has been created a layer of photoresist 208 can be applied to the top side of wafer 200. In one example, a blanket coating process can be used to apply a uniform layer of photoresist material 208 (e.g., UV-sensitive photoresist, negative photoresist, positive photoresist) to the top side of wafer 200 and the recess of trench 206. Photoresist material 208 can be exposed and developed out within the region of trench 206, as shown in FIG. 2D. This step leaves deposits of photoresist material 208 on the top side of wafer 200.

Figure 2E:
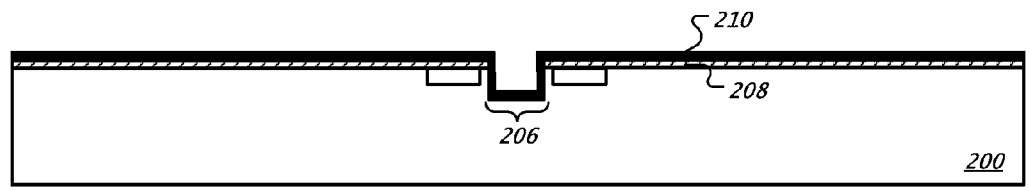
Figure 2F:
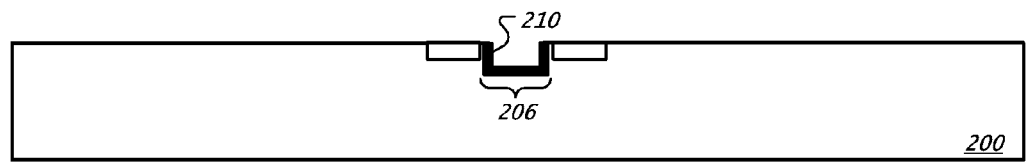

FIG. 2E illustrates a layer of wire bondable metal 210 (e.g., aluminum, ti-tungsten-gold or other suitable metallurgy for wire-bonding that can also adhere to silicon materials) deposited on the top side of wafer 200, including within the recess of trench 206. In some implementations, a vacuum deposition technique can be used to deposit wire bondable metal layer 210 on the top side of wafer 200. As shown in FIG. 2F, after stripping off the layer of photoresist material 208, only wire bondable metal 210 lining trench 206 remains.

Figure 2G:
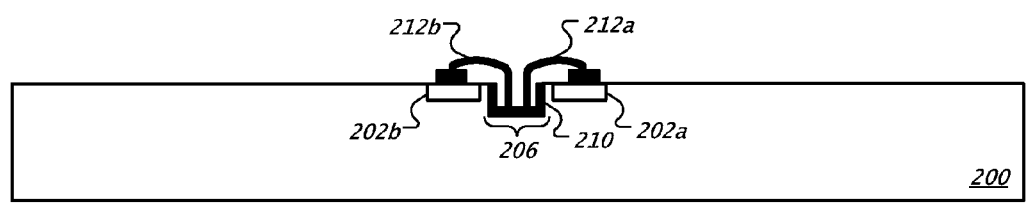

A pair of bonding wires 212 can be added to wafer 200, as shown in FIG. 2G, connecting bond pads 202 to wire bondable metal layer 210 within trench 206. Standard wire bonding techniques, for example, can be used to attach bonding wires 212 from bond pads 202 to the base of trench 206. In some examples, bonding wires 212 can be made of gold, copper, aluminum or other suitable metal. Coated or insulated bonding wires 212 can be used.

Figure 2H:
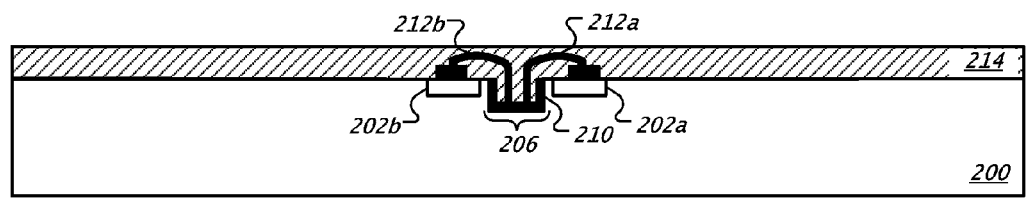
Figure 2I:
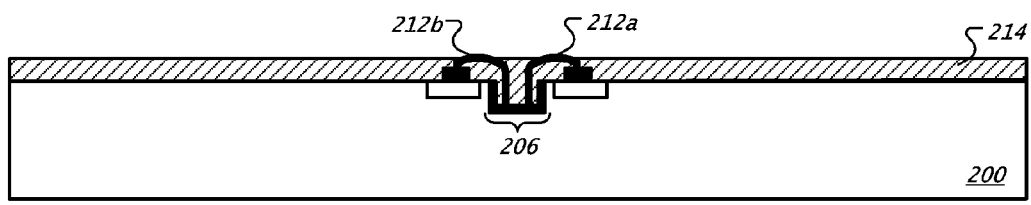
Figure 2J:
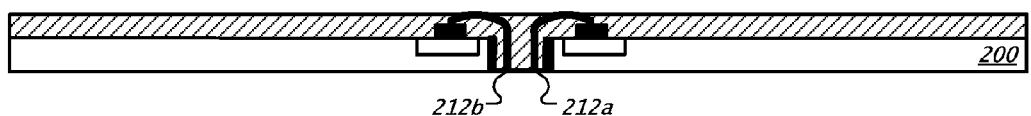

As shown in FIG. 2H, wafer 200 can be coated with a layer of organic material 214. Organic material 214 covers bonding wires 212. Organic material 214 can be thinned (as shown in FIG. 2I) to expose bonding wires 212. For example, using a grinding machine, organic material 214 can be ground down to expose bonding wires 212. Similarly, the bottom side of wafer 200 can be thinned, as shown in FIG. 2J, to expose bonding wires 212 at the base of trench 206.

Example Implementations

FIG. 3A is a cross-sectional view illustrating an example semiconductor wafer 300 with bottom side electrical connections. Some WLCSP applications require exposed circuitry on the top side of the wafer. For example, a WLCSP for image or fingerprint sensor circuitry (e.g., photodiode for a camera, biometric chip for secure identification, CMOS image sensor) can be created using the process of FIG. 2 to provide exposed active circuit area on the top and/or bottom sides of wafer 300.

The wafer 300 has two exposed circuit areas 302. The remainder of the top side surface of wafer 300 is covered with organic coating 304 (e.g., epoxy, epoxy mold compound, Benzocyclobutene (BCB), polyamide). In some examples, organic coating 304 can be applied using an overmolding, auto-dispensing, or spin coating fabrication method. Organic coating 304 covers bonding wires 306. Bonding wires 306 are attached to bond pads 308. Bonding wires 306 are routed through scribe region 310 to the bottom side of wafer 300, as previously described in reference to FIGS. 2A-2J.

The electrical connections from bonding wires 306 can be routed along the bottom side of wafer 300 using RDL 312. Solder bumps 314 can be attached to RDL 312 to allow mating of electrical connections from bond pads 308 to a PCB or other IC device.

FIG. 3B illustrates a first singulated IC die 320 and a second singulated IC die 330. Singulated IC dies 320, 330 can be produced by separating (e.g., sawing) wafer 300 along scribe region 310 (indicated by dashed line). After singulation, singulated IC dies 320, 330 can be mounted to other circuitry using solder bumps 314, for example.

While this document contains many specific implementation details, these should not be construed as limitations on the scope what may be claimed, but rather as descriptions of features that may be specific to particular embodiments. One implementation that this invention has made possible is stacked-die packaging. For example, solder balls such as the solder balls 108 (as shown in FIG. 1A) formed on the bottom surface of a first WLCSP can be attached to connection pads such as the connection pads 112 (as shown in FIG. 1B) which are formed on the top (e.g., circuit-side) surface of a second WLCSP. A stacked-die package can be created by attaching bottom-mounted solder balls to top-formed connection pads in this manner. This step can be repeated to create a multiple die stacked-die package. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made. For example, steps of one or more processes may be combined, deleted, modified, or supplemented to form further processes. As yet another example, the process steps depicted in the figures do not require the particular order shown to achieve desirable results. In addition, other steps may be provided, or steps may be eliminated, from the described processes, and other materials may be added to, or removed from, the described processes. Accordingly, other implementations are within the scope of the following claims.

What is claimed is:

1. An integrated circuit wafer, comprising:
   a first side and a second side;
   coating material formed on the first side;
   a scribe region between a first integrated circuit die and a second integrated circuit die;
   a trench formed in the wafer at the scribe region, the trench extending from the first side to the second side and filled with the coating material;
   a number of bond pads formed on the first side and distributed on opposite sides of the trench; and
   a number of bonding wires connected to the bond pads, the bonding wires extending through the trench and at least partially exposed on the first or second sides, each wire extending from the first side on the first integrated circuit die to the second side on the first integrated circuit die or the first side on the second integrated circuit die to the second side on the second integrated circuit die.

2. The wafer of claim 1, where the coating material is an organic coating material.

3. The wafer of claim 1, further comprising:
   a dielectric layer formed on the second side.

4. The wafer of claim 1, further comprising:
   a number of pad sites disposed on the first or second sides for connecting with exposed bonding wires.

5. The wafer of claim 4, where the pad sites are connected to exposed bonding wires by metal traces in a redistribution layer formed on the first or second sides.

6. The wafer of claim 4, where the pad sites are connected to solder balls.

7. The wafer of claim 1, where the bonding wires are coated or insulated.

* * * * *